United States Patent
Tinsley et al.

(10) Patent No.: US 9,660,605 B2
(45) Date of Patent: May 23, 2017

(54) VARIABLE DELAY LINE USING VARIABLE CAPACITORS IN A MAXIMALLY FLAT TIME DELAY FILTER

(71) Applicant: Honeywell International Inc., Morristown, NJ (US)

(72) Inventors: Robert Jason Tinsley, Norcross, GA (US); Marc Pos, Duvall, WA (US); Paul David Ferguson, Redmond, WA (US)

(73) Assignee: Honeywell International Inc., Morris Plains, NJ (US)

( * ) Notice: Subject to any disclaimer, the term of this patent is extended or adjusted under 35 U.S.C. 154(b) by 238 days.

(21) Appl. No.: 14/303,180

(22) Filed: Jun. 12, 2014

(65) Prior Publication Data

US 2015/0365064 A1 Dec. 17, 2015

(51) Int. Cl.
*H03H 7/32* (2006.01)
*G01S 13/88* (2006.01)
*H03H 11/26* (2006.01)

(52) U.S. Cl.
CPC ........... *H03H 7/325* (2013.01); *G01S 13/882* (2013.01); *H03H 11/265* (2013.01)

(58) Field of Classification Search
CPC H03H 7/30; H03H 7/32; H03H 7/325; H03H 7/34; H03H 7/345; H03H 7/0138; H03H 11/265; G01S 13/88; G01S 13/882
USPC .................................. 333/138, 139; 342/120
See application file for complete search history.

(56) References Cited

U.S. PATENT DOCUMENTS

| 3,021,521 A | 2/1962 | Hutchins |
| 3,611,377 A | 10/1971 | Rittenbach |
| 3,699,480 A | 10/1972 | Mueller |
| 3,774,206 A * | 11/1973 | Rauch ................... G01S 13/325 342/120 |
| 4,577,163 A | 3/1986 | Culp |
| 4,604,591 A | 8/1986 | Vasile |
| 4,695,013 A | 9/1987 | Trampnau |
| 4,701,714 A | 10/1987 | Agoston |

(Continued)

FOREIGN PATENT DOCUMENTS

| DE | 19855367 | 6/2000 |
| DE | 19915247 | 10/2000 |

(Continued)

OTHER PUBLICATIONS

European Patent Office, "Extended EP Search Report from EP Application No. 15168777.9 mailed Nov. 17, 2015", "from Foreign Counterpart of U.S. Appl. No. 14/303,180", Nov. 17, 2015, pp. 1-8, Published in: EP.

(Continued)

*Primary Examiner* — Benny Lee
*Assistant Examiner* — Albens Dieujuste
(74) *Attorney, Agent, or Firm* — Fogg & Powers LLC (57) ABSTRACT

Systems and methods for a variable delay line using variable capacitors in a time delay filter are provided. In at least one embodiment, a delay line is configured to apply an adjustable time delay to an electromagnetic signal travelling through the delay line. The delay line comprises a filter that includes a first variable capacitor. Further, a capacitance of the first variable capacitor is configured to adjust the delay applied to the electromagnetic signal travelling through the delay line when varied.

18 Claims, 3 Drawing Sheets

(56) References Cited

U.S. PATENT DOCUMENTS

| | | | |
|---|---|---|---|
| 4,725,842 A | 2/1988 | Mayberry | |
| 4,728,953 A | 3/1988 | Richmond | |
| 4,825,214 A | 4/1989 | Dejaegher | |
| 4,945,360 A | 7/1990 | Trummer et al. | |
| 4,965,533 A | 10/1990 | Gilmore | |
| 4,967,201 A | 10/1990 | Rich, III | |
| 4,968,967 A | 11/1990 | Stove | |
| 5,353,038 A | 10/1994 | Osborne et al. | |
| 5,548,243 A | 8/1996 | Sun et al. | |
| 5,719,581 A | 2/1998 | Poe | |
| 5,757,239 A | 5/1998 | Gilmore | |
| 5,757,311 A | 5/1998 | Voyce | |
| 6,043,758 A | 3/2000 | Snyder, Jr. et al. | |
| 6,087,980 A | 7/2000 | Saryo | |
| 6,154,640 A | 11/2000 | Itoh et al. | |
| 6,295,020 B1 | 9/2001 | Koechlin | |
| 6,373,427 B1 | 4/2002 | Hohne | |
| 6,384,770 B1 | 5/2002 | de Gouy et al. | |
| 6,407,697 B1 | 6/2002 | Hager et al. | |
| 6,426,717 B1 | 7/2002 | Maloratsky | |
| 6,486,826 B1 | 11/2002 | Cramer et al. | |
| 6,556,096 B1 * | 4/2003 | Ouacha | H03H 11/265 333/138 |
| 7,161,527 B2 | 1/2007 | Vacanti | |
| 7,239,266 B2 | 7/2007 | Vacanti | |
| 7,295,151 B2 | 11/2007 | Vacanti | |
| 7,463,710 B2 | 12/2008 | Walsh et al. | |
| 7,791,415 B2 | 9/2010 | Hornbuckle | |
| 7,825,851 B2 | 11/2010 | Vacanti | |
| RE42,316 E | 5/2011 | Vacanti | |
| 8,085,097 B2 | 12/2011 | Cloutier et al. | |
| 8,259,002 B2 | 9/2012 | Vacanti et al. | |
| 8,324,515 B2 | 12/2012 | Stevenson et al. | |
| 8,638,139 B2 | 1/2014 | Keaveney et al. | |
| 8,917,204 B2 | 12/2014 | Trotta et al. | |
| 2002/0066829 A1 | 6/2002 | DeWitt et al. | |
| 2002/0112218 A1 | 8/2002 | Nakamura et al. | |
| 2002/0135970 A1 | 9/2002 | Klee et al. | |
| 2003/0201930 A1 | 10/2003 | Nagasaku et al. | |
| 2004/0130482 A1 | 7/2004 | Lin et al. | |
| 2004/0135703 A1 | 7/2004 | Arnold et al. | |
| 2005/0225330 A1 | 10/2005 | Ochiai et al. | |
| 2006/0049977 A1 | 3/2006 | Vacanti | |
| 2006/0262475 A1 | 11/2006 | Katsumata et al. | |
| 2008/0246649 A1 | 10/2008 | Backes et al. | |
| 2010/0225524 A1 | 9/2010 | Szajnowski | |
| 2010/0283665 A1 | 11/2010 | Bashir et al. | |
| 2011/0122017 A1 | 5/2011 | Vacanti | |
| 2011/0205105 A1 | 8/2011 | Reuter | |
| 2012/0112806 A1 | 5/2012 | Dayi | |
| 2012/0242383 A1 | 9/2012 | Elad et al. | |
| 2012/0256781 A1 | 10/2012 | Vacanti et al. | |
| 2013/0033402 A1 | 2/2013 | Meyer | |
| 2013/0214963 A1 | 8/2013 | Vacanti | |
| 2013/0214964 A1 | 8/2013 | Holt | |
| 2014/0028491 A1 | 1/2014 | Ferguson | |
| 2014/0070985 A1 | 3/2014 | Vacanti | |
| 2015/0378017 A1 | 12/2015 | Ferguson et al. | |

FOREIGN PATENT DOCUMENTS

| | | |
|---|---|---|
| EP | 0138253 A2 | 4/1985 |
| EP | 1227536 | 7/2002 |
| EP | 2690455 | 1/2014 |
| GB | 2007930 | 5/1979 |
| JP | 60008197 | 1/1985 |
| JP | 6120735 | 4/1994 |
| JP | 8097744 | 4/1996 |
| JP | H08125701 | 5/1996 |
| JP | 11148972 | 6/1999 |
| JP | 2000151328 | 5/2000 |
| JP | 2002353709 | 12/2002 |
| JP | 2003018001 | 1/2003 |
| JP | 200527246 | 1/2005 |
| JP | 2005151444 | 6/2005 |
| JP | 2013200135 | 10/2013 |
| TW | 580579 | 3/2004 |
| WO | 9935740 | 7/1999 |
| WO | 2011064157 | 6/2011 |

OTHER PUBLICATIONS

European Patent Office, "Extended European Search Report from EP Application No. 15170178.6 mailed Nov. 5, 2015", "from Foreign Counterpart of U.S. Appl. No. 14/316,176", Nov. 5, 2015, pp. 1-8, Published in: EP.

Thompson, "Intuitive Analog Circuit Design", Dec. 6, 2013, pp. 571-572, Publisher: Newnes, Elsevier, Published in: US.

Belfiori, "Antenna Array Signal Processing for Multistatic Radar Systems", Jun. 12, 2013, pp. i-146, Published in: IT.

Gupta, "Optimization and Realization of tunable Band pass Filters", "retrieved on Feb. 20, 2014 from Internet http://www.linkedin.com/pub/navam-gupta/4a/862/248", May 2011-Jul. 2011, pp. 1-3.

Pavlenko, "Tunable lumped-element bandpass filters for Cognitive Radio application", "Master's Degree Programme in Technomathematics and Technical Physics", May 2013, pp. i-49.

Japan Patent Office, "Notification of Reasons for Rejection from JP Application No. 2007-530115 mailed Apr. 25, 2011", "from Foreign Counterpart of U.S. Appl. No. 10/926,676", Apr. 25, 2011, pp. 1-8, Published in: JP.

Japan Patent Office, "Notice of Reason for Rejection from JP Application No. 2007-530115 mailed Jul. 9, 2012", "from Foreign Counterpart of U.S. Appl. No. 10/926,676", Jul. 9, 2012, pp. 1-6, Published in: JP.

Japanese Patent Office, "Office Action from JP Application No. 2012-244383 mailed Aug. 2, 2013", "from Foreign Counterpart of U.S. Appl. No. 10/926,676", Aug. 2, 2013, pp. 1-9, Published in: JP.

U.S. Patent and Trademark Office, "Notice of Allowance", "U.S. Appl. No. 10/926,676", Mar. 14, 2007, pp. 1-6, Published in: US.

U.S. Patent and Trademark Office, "Office Action", "U.S. Appl. No. 10/926,676", Apr. 17, 2006, pp. 1-10, Published in: US.

U.S. Patent and Trademark Office, "Final Office Action", "U.S. Appl. No. 10/926,676", Sep. 8, 2006, pp. 1-9, Published in: US.

European Patent Office, "European Search Report from EP Application No. 13155116.0 mailed Jun. 7, 2013", "from Foreign Counterpart of U.S. Appl. No. 13/662,755", Jun. 7, 2013, pp. 1-3, Published in: EP.

U.S. Patent and Trademark Office, "Notice of Allowance", Jun. 27, 2014, pp. 1-31, U.S. Appl. No. 13/662,755, Published in: US.

European Patent Office, "Office Action from EP Application No. 13154997.4 mailed Jun. 19, 2013", "from Foreign Counterpart of U.S. Appl. No. 13/760,347", Jun. 19, 2013, pp. 1-6, Published in: EP.

European Patent Office, "European Search Report from EP Application No. 13154997.4 mailed Jun. 6, 2013", "from Foreign Counterpart of U.S. Appl. No. 13/760,347", Jun. 6, 2013, pp. 1-3, Published in: EP.

Appel, "Fractional N Synthesizers", "RF Signal Processing", Nov. 2000, pp. 1-9.

Benard, "A High-Stability Low-Offset Phase-Locked-Loop Frequency Synthesizer", "IEEE Transactions on Instrumentation and Measurement", Sep. 1975, pp. 222-224, vol. IM-24, No. 3.

"KRA 10A Radar Altimeter", May 2000, pp. 1-4, Publisher: Allied Signal Aerospace.

Bisanti et al., "Fully integrated Sigma-Delta Synthesizer Suitable for 'Indirect VCO modulation' in 2.5G application", "2003 IEEE Radio Frequency Integrated Circuits Symposium", at least as early as Dec. 2003, pp. 515-518.

"TRA-3000 and TRA-3500 Radar Altimeters", Feb. 2009, pp. 1-2, Publisher: Free Flight Systems.

Caglio et al., "An Integrated GaAs 1.25 GHz Clock Frequency FM-CW Direct Digital Synthesizer", Oct. 1993, pp. 167-170.

"Honeywell HG8500 Series Radar Altimeter", Jul. 2003, pp. 1-2, Publisher: Honeywell International Inc.

(56) References Cited

OTHER PUBLICATIONS

Jeong et al., "A Multi-Beam and Multi-Range Radar with FMCW and Digital Beam Forming for Automotive Applications", "Progress in Electromagnetics Research", Nov. 2011, pp. 285-299, vol. 124.
Nash, "Phase-Locked Loop Design Fundamentals", Feb. 2006, pp. 1-22, Publisher: Freescale Semiconductor.
Pazarci, "Phase-Lock Systems (ELE608E-01)", Jan. 27, 2009, pp. 1-2.
Reynolds et al., "Single chip FMCW radar for target velocity and range sensing applications", "Gallium Arsenide Integrated Circuit (GaAs IC) Symposium, 1989. Technical Digest 1989., 11th Annual", Oct. 1989, pp. 243-246.
"Miniature Radar Altimeter: MRA Type 1", May 2012, pp. 1-2, Publisher: Roke Manor Research Limited.
"Miniature Radar Altimeter: MRA Type 2", May 2012, pp. 1-2, Publisher: Roke Manor Research Limited.
Saul, "Direct Frequency Synthesis: A Review of the Technique and Potential", Jul. 1990, pp. 5-9, Publisher: Plessey Research Caswell, U.K.
"Micro Radar Altimeter: UMRR-0A", Dec. 2011, pp. 1-2, Publisher: S.M.S. Smart Microwave Sensors GmbH.
"Radar Altimeter System Comparison", Dec. 2011, pp. 1 Publisher: Southeast Aerospace.
"Fractional/Integer-N PLL Basics", Aug. 1999, pp. 1-55, Publisher: Texas Instruments.
Ferguson et al., "Systems and Methods for Calibration and Optimization of Frequency Modulated Continuous Wave Radar Altimeters Using Adjustable Self-Interference Cancellation", "U.S. Appl. No. 14/316,176, filed Jun. 26, 2014", Jun. 26, 2014, pp. 1-23, Published in: US.
U.S. Patent and Trademark Office, "Office Action", "U.S. Appl. No. 14/316,176", Aug. 19, 2016, pp. 1-76, Published in: US.

\* cited by examiner

VARIABLE DELAY LINE USING VARIABLE CAPACITORS IN A MAXIMALLY FLAT TIME DELAY FILTER

BACKGROUND

Systems often require that certain electrical signals be delayed in time with respect to other signals in order to perform various signal processing or conditioning functions. Methods for providing an electrical time delay include, but are not limited to, transmission line delay lines, surface and bulk acoustic wave delay lines, and tapped digital delay circuits.

SUMMARY

Systems and methods for a variable delay line using variable capacitors in a time delay filter are provided. In at least one embodiment, a delay line is configured to apply an adjustable time delay to an electromagnetic signal travelling through the delay line. The delay line comprises a filter that includes a first variable capacitor. Further, a capacitance of the first variable capacitor is configured to adjust the delay applied to the electromagnetic signal travelling through the delay line when varied.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

As stated above, methods for providing an electrical time delay include, but are not limited to, transmission line delay lines, surface and bulk acoustic wave delay lines, and tapped digital delay circuits. Electrical filters are also known to provide time delay; however, the amount of delay available from a typical filter structure is small compared with the requirements of many systems. One limitation of these methods is that they only provide a fixed value of delay that is typically chosen during design of the system. If a unique delay value is required for each instance of the system, the value must be determined and chosen at the time of manufacture. This becomes costly and difficult to manage. A second limitation of many implementations of delay lines, especially filter implementations, is that the amount of delay varies versus frequency. This makes them suitable for use as delay lines only over a very limited frequency bandwidth.

As stated above, there are disadvantages to the conventional implementations for delaying an electrical signal, such as only providing a fixed delay and in the case of filters, providing different delays for different signal frequencies. The embodiments described herein solve these limitations by utilizing a filter structure that includes tuning capabilities for adjusting both the absolute delay and also compensating for the delay variation as a function of frequency. In some embodiments the filter includes a first variable capacitor so that the delay can be tuned by adjusting the capacitance of the first variable capacitor. In exemplary embodiments, the first variable capacitor is a variable shunt capacitor. In some other embodiments, the first variable capacitor is a variable series capacitor. Moreover, in some embodiments, a second variable capacitor is included in the filter in order to adjust the peak-to-peak delay variation for signals with different frequencies in the passband of the filter. In exemplary embodiments, the second variable capacitor is a variable series capacitor. The delay line embodiments as described herein can be used in many different applications including, but not limited to, radar systems using frequency modulated continuous wave (FMCW) techniques, such as monostatic radar altimeters, some forms of radars using pulse compression techniques, communication systems using spread spectrum techniques, amplifier circuits, transceivers and receivers used in communication systems, quadrature modulation circuits and other types of electronic systems.

Figure 1A:
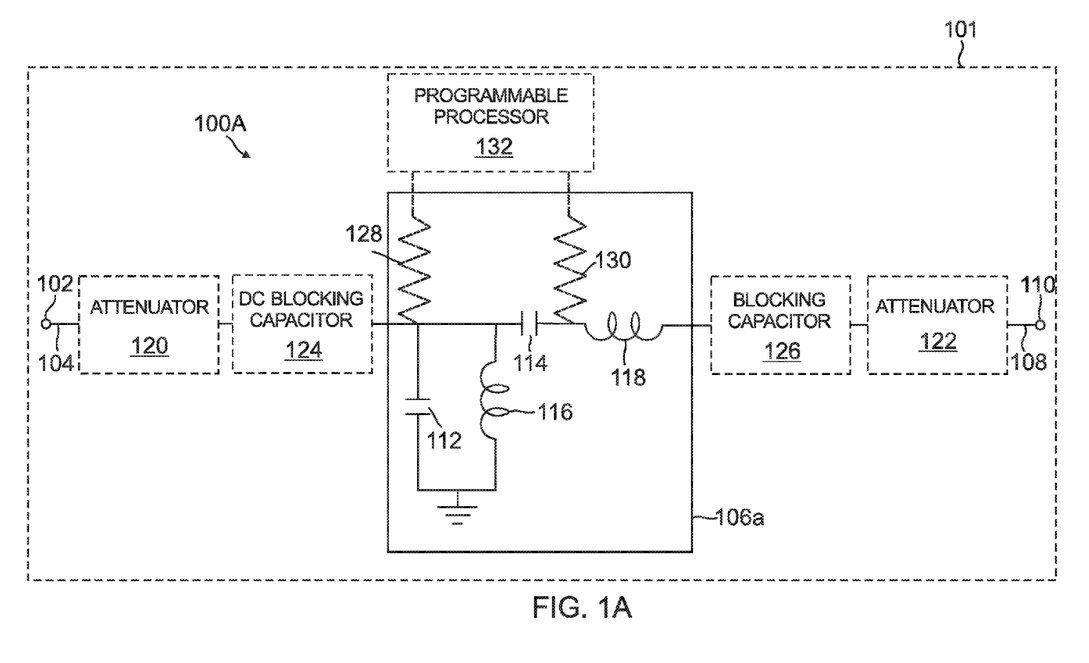
FIGS. 1A-1B are diagrams of exemplary delay lines configured to apply an adjustable time delay to an electromagnetic signal travelling through the delay lines.

FIG. 1A is an example of a delay line 100A configured to delay an electromagnetic signal travelling through the delay line 100A. In exemplary embodiments, the delay line 100A is integrated into an optional radar altimeter system 101. In exemplary embodiments, the electromagnetic signal travelling through the delay line 100A is a radar altimeter signal. Delay line 100A includes at least one delay line input 102, at least one input transmission line media 104, at least one filter 106A, at least one output transmission line media 108, at least one delay line output 110, optional attenuators 120, 122, optional DC blocking caps 124, 126 and an optional programmable processor 132. Delay line 100A delays an electromagnetic signal that travels through the delay line 100A. The delay of the signal can depend on the length of the delay line 100A and the capacitance and inductance of the filter 106A. In exemplary embodiments, the length of the delay line 100A is chosen so that the signal received at the at least one delay line input 102 is delayed by the amount necessary to synchronize the phase of the delayed signal at the at least one delay line output 110 with the phase of the signal that the delayed signal will be combined with. This can be done by configuring the physical length of the at least one input transmission line media 104 and/or the at least one output transmission line media 108 appropriately. In exemplary embodiments, the delay of a signal travelling through the delay line 100A can range from tenths of nanoseconds to several milliseconds, depending on the length of the delay line 100A, the propagation speed of the signal in the medium and the inductances and capacitances of the filter 106A.

The at least one input transmission line media 104 and the at least one output transmission line media 108 in delay line 100A can be implemented in any of the following: microstrip, coaxial cable, stripline, coplanar waveguide, and the like; however, this list is exemplary and not meant to be limiting. The at least one input transmission line media 104 and the at least one output transmission line media 108 can be used to transfer electromagnetic energy between the at least one delay line input 102, the at least one delay line output 110 and any of the components included in delay line 100A.

The filter 106A inserted into the delay line 100A can be any type of filter, including a bandpass filter, an all-pass filter, a low-pass filter or a high-pass filter. In some embodiments, the filter 106A inserted into the delay line 100A comprises at least one first variable capacitor 112, 114. In some embodiments, the filter 106A can also include at least one first inductor 116, 118. In exemplary embodiments, the filter can be a bandpass filter 106A and comprise at least one first variable shunt capacitor 112, at least one second variable series capacitor 114, at least one first shunt inductor 116 and at least one second series inductor 118 inserted into the at least one delay line 100A. The function of each of these components is discussed below. In exemplary embodiments, the bandpass filter 106A is a second-order bandpass filter comprising only a single first variable shunt capacitor 112, a single shunt inductor 116, a single second variable series capacitor 114, and a single series inductor 118, as shown in FIG. 1A. In other exemplary embodiments, other quantities of inductors and capacitors are included and can be shunt capacitors, shunt inductors, series capacitors and series inductors or a combination thereof. The inductors 116, 118 can have a fixed value and be implemented in any transmission line media, such as microstrip, or by discrete components.

The filter 106A inserted into the delay line 100A has a few different purposes in exemplary embodiments. First, in embodiments where the filter 106A is a bandpass filter, the filter 106A can allow a signal whose frequency is between the two cut-off frequencies to be passed by the delay line 100A, while signals with frequencies outside of the two cut-off frequencies are not allowed to pass through the delay line 100A. The frequency range between the two cut-off frequencies is called the passband. The cut-off frequencies can be varied depending on the choice of inductances 116, 118 and capacitances 112, 114 in the bandpass filter 106A. In some embodiments where the delay line 100A is used in radar altimeter applications, the passband of the bandpass filter 106A allows frequencies from 4.2-4.4 gigahertz to pass through delay line 100A after the apparatus 100A is tuned according to the examples described below.

Second, the filter 106A can delay an electromagnetic signal that passes through the delay line 100A. The filter 106A does this by including at least one first variable capacitor 112, 114, wherein the capacitance of the at least one first variable capacitor 112, 114 is varied to adjust the delay for a signal travelling through the delay line 100A. More specifically, the capacitance of the at least one first variable capacitor 112, 114 is adjusted to achieve the desired delay of the signal travelling in the delay line 100A. In exemplary embodiments, the at least one first variable capacitor 112, 114 is a variable shunt capacitor 112. In other embodiments, the at least one first variable capacitor 112, 114 is a variable series capacitor 114.

In exemplary embodiments, the at least one first variable capacitor 112, 114 used to adjust the delay for a signal travelling through the delay line 100A can be an electronically variable capacitor 112, 114. If the at least one first variable capacitor 112, 114 is an electronically variable capacitor 112, 114, then the electronically variable capacitor 112, 114 can be in the form of a varicap diode, a varactor diode, a variable capacitance diode, a variable reactance diode, a tuning diode, a digitally tuned capacitor, etc. In embodiments where the at least one first variable capacitor 112, 114 is a varactor diode, the capacitance of the varactor diode is varied in accordance with the magnitude of a reverse-bias voltage injected through resistors 128, 130 applied across the terminals of the varactor diode, wherein the reverse-bias voltage injected through resistors 128, 130 can be controlled by a programmable processor 132. Programmable processor 132 can be a microcontroller, a microprocessor (e.g., a digital signal processor (DSP)), a field programmable switch array (FPGA), an application specific integrated circuit (ASIC), a central processing unit (CPU) coupled to a memory device or other programmable device. In addition, in some embodiments, a digital-to-analog converter can be included with the programmable processor 132 to change the digital output into an analog output for use in controlling the reverse-bias voltage injected through resistors 128, 130. When the capacitance in the electronically variable capacitor 112, 114 is changed due to a change in the reverse-bias voltage injected through resistors 128, 130, the time delay of a signal travelling along the delay line 100A changes. This is different than in conventional implementations where a capacitor 112, 114 and an inductor 116, 118 are used to tune a filter for a specific frequency band in order to maximize the return loss and minimize the insertion loss. In some embodiments, the at least one first variable capacitor 112, 114 can be a mechanically variable capacitor 112, 114.

When the capacitance of the at least one first variable capacitor 112, 114 is adjusted to increase (or decrease) the delay for a signal travelling through the delay line 100A, the slope of the delay as a function of frequency changes. Stated another way, there is more peak-to-peak delay variation for signals with different frequencies in the passband of the filter 106A when the delay in the delay line 100A is increased (or decreased). To counter this effect, the filter 106A can have a third purpose, namely, to decrease (or increase) the peak-to-peak delay variation for signals with different frequencies in the passband of the filter 106A. To accomplish this, in exemplary embodiments, the filter 106A includes at least one second variable capacitor 112, 114, such that the capacitance of the at least one second variable capacitor is configured to adjust the peak-to-peak delay variation for signals with different frequencies in a passband of the filter 106A when varied. In some embodiments, the filter 106A can also include at least one second inductor 116, 118. In exemplary embodiments, the at least one first variable capacitor 112, 114 used to increase (or decrease) the delay for a signal travelling through the delay line 100A is a variable shunt capacitor 112; and, the at least one second variable capacitor 112, 114 used to adjust the peak-to-peak delay variation for signals with different frequencies is a variable series capacitor 114. In exemplary embodiments, the capacitance of the at least one second variable series capacitor 114 can be adjusted to decrease the peak-to-peak delay variation to less than two picoseconds.

Similar to above, the at least one second variable capacitor 112, 114 used to adjust the peak-to-peak variation for signals with different frequencies can be an electronically variable capacitor 112, 114; and in other embodiments, the at least one second variable capacitor 112, 114 can be a mechanically variable capacitor 112, 114. When the at least one second variable capacitor 112, 114 is an electronically variable capacitor 112, 114, then the electronically variable capacitor 112, 114 can be in the form of a varicap diode, a varactor diode, a variable capacitance diode, a variable reactance diode, a tuning diode, a digitally tuned capacitor, etc. In embodiments where the at least one second variable capacitor 112, 114 is a varactor diode, the capacitance of the varactor diode is varied in accordance with the magnitude of a reverse-bias voltage injected through resistors 128, 130 applied across the terminals of the varactor diode. In exemplary embodiments, the reverse-bias voltage injected through resistors 128, 130 can be controlled by a programmable processor 132, such as a microcontroller, a microprocessor (e.g., a digital signal processor (DSP)), a field programmable switch array (FPGA), an application specific integrated circuit (ASIC), a central processing unit (CPU) coupled to a memory device or other programmable device. Similar to above, in some embodiments, a digital-to-analog converter can be included with the programmable processor 132 to change the digital output into an analog output for use in controlling the reverse-bias voltage injected through resistors 128, 130.

In some embodiments, such as when the filter 106A is a bandpass filter, tuning the variable shunt capacitor 112 and tuning the variable series capacitor 114 can be an iterative process, i.e., retuning a capacitance that has already been tuned in order to achieve the desired delay and the desired peak-to-peak variation. For example, if the variable series capacitor 114 is used to adjust the peak-to-peak delay variation for signals with different frequencies, then after the variable series capacitor 114 is tuned to adjust the peak-to-peak delay variation for signals with different frequencies, the variable shunt capacitor 112 is retuned to achieve the desired delay. In some embodiments, this can be helpful since tuning the variable series capacitor 114 to adjust the peak-to-peak delay variation for signals with different frequencies may change the delay in the delay line 100A. After the variable shunt capacitor 112 is retuned, it may be necessary to retune the variable series capacitor 114 to achieve the desired peak-to-peak delay variation. This process can be repeated as many times as necessary to achieve the desired delay in the delay line 100A and peak-to-peak variation across the passband of the filter 106A. In some other embodiments, tuning the variable shunt capacitor 112 and tuning the variable series capacitor 114 can be set by applying the desired bias voltages without iteration, i.e., not retuning a capacitance, to achieve the desired delay and delay variation.

As stated above, in some embodiments, delay line 100A can include optional attenuators 120, 122. In at least one embodiment, optional attenuator 120 can be inserted into delay line 100A between the at least one input transmission line media 104 and the input to the filter 106A. Further, in at least one embodiment, optional attenuator 122 can be inserted into delay line 100A between the at least one output transmission line media 108 and the output of the filter 106A. Optional attenuator 120 and optional attenuator 122 can reduce the input power and improve overall delay line 100A return loss to allow for return loss degradation of the filter due to changing capacitances.

In some embodiments, delay line 100A can include optional DC blocking capacitors 124, 126. Optional DC blocking capacitors 124, 126 can be useful if electronically variable capacitors are used as the variable shunt capacitor 112 and the variable series capacitor 114 as explained below. In some embodiments, the optional DC blocking capacitor 124 can be inserted between the at least one input transmission line media 104 and the input of the filter 106A. Additionally, the optional DC blocking capacitor 126 can be inserted between the output of the filter 106A and the at least one output transmission line media 108. In embodiments where optional attenuators 120, 122 are included in delay line 100A, the optional DC blocking capacitors 124 and 126 can be inserted between the filter 106A and optional attenuators 120, 122, respectively. When optional DC blocking capacitors 124, 126 are inserted into delay line 100A, each optional DC blocking capacitor 124, 126 can help block DC signals, such as the one used to bias the electronically variable capacitors 124, 126, from going beyond the filter 106A and into the at least one delay line input 102 and/or the at least one delay line output 110.

Figure 1B:
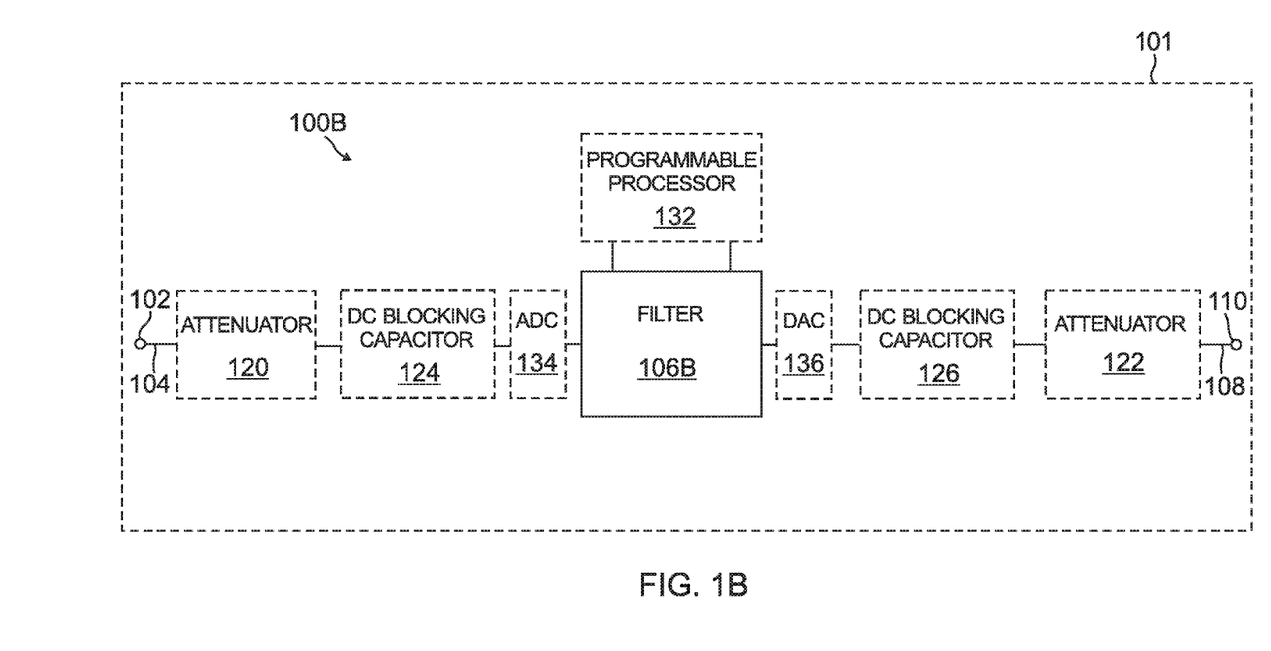

FIG. 1B is another example of a delay line 100B configured to delay an electromagnetic signal travelling through the delay line 100B. In exemplary embodiments, the delay line 100B is integrated into an optional radar altimeter system 101. In exemplary embodiments, the electromagnetic signal traveling through the delay line 100B is a radar altimeter signal. Delay line 100B includes at least one delay line input 102, at least one input transmission line media 104, at least one filter 106B, at least one output transmission line media 108, at least one delay line output 110, optional attenuators 120, 122, optional blocking capacitors 124, 126, an optional analog-to-digital converter (ADC) 134, an optional digital-to-analog converter (DAC) 136 and an optional programmable processor 132. In exemplary embodiments, the optional ADC 134 converts the analog electromagnetic signal travelling through the delay line 100B into a digital representation. Next, the filter 106B can perform the same functions as the filter 106A in FIG. 1A above, except that the filter 106B performs the functions digitally using a programmable processor 132, such as a microcontroller, a microprocessor (e.g., a digital signal processor (DSP)), a field programmable switch array (FPGA), an application specific integrated circuit (ASIC), a central processing unit (CPU) coupled to a memory device or other programmable device. In some embodiments, the programmable processor 132 is included in the filter 106B and in other embodiments, the programmable processor 132 is not included in the filter 106B, as shown in FIG. 1B. After the filter 106B delays the signal and adjust the peak-to-peak delay variation for signals with different frequencies in a passband of the filter 106B, the optional DAC 136 can convert the signal back to an analog representation, which will then be transferred to the at least one delay line output 110 by the at least one output transmission line media 108. In other embodiments, the optional ADC 134 and optional DAC 136 are not present and the filter 106B performs the same functions as the filter 106A in FIG. 1A above.

Figure 2:
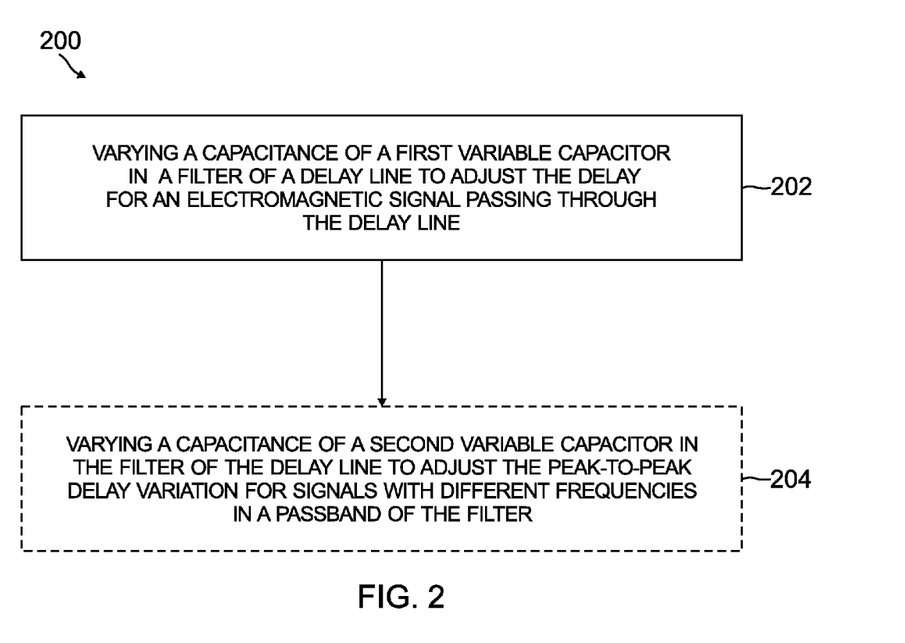
FIG. 2 is a flow diagram of an exemplary method for varying the delay of an electromagnetic signal travelling through a delay line.

FIG. 2 is a flow diagram of an example method 200 for varying the delay of an electromagnetic signal travelling through a delay line. The method 200 comprises varying the capacitance of at least one first variable capacitor in a filter of a delay line to adjust the delay for an electromagnetic signal passing through the delay line (block 202). In some embodiments, the filter can also include at least one first inductor. The at least one first inductor can have some or all of the same properties as the at least one first inductor 116, 118 discussed above. As stated above, when the capacitance of the at least one first variable capacitor is changed, the time delay of a signal travelling along the delay line changes. Due to this effect, the delay experienced by a signal travelling through the at least one delay line can be changed. The at least one first variable capacitor can have some or all of the same characteristics as the at least one first variable capacitor 112, 114 discussed above; and therefore, the capacitance of the at least one first variable capacitor in method 200 can be varied in the same way as above in FIG. 1A. Moreover, the at least one first variable capacitor can be an electronically variable capacitor such as in the form of varactor diodes. In exemplary embodiments, the at least one first variable capacitor is a variable shunt capacitor. In other embodiments, the at least one first variable capacitor is a variable series capacitor.

In some embodiments, method 200 further comprises optionally varying the capacitance of at least one second variable capacitor in the filter of the delay line to adjust the peak-to-peak delay variation for signals with different frequencies in a passband of the filter. In some embodiments, the filter can also include at least one second inductor. The at least one second inductor can have some or all of the same properties as the at least one second inductor 116, 118 discussed above.

Similar to above, when the capacitance of the at least one first variable capacitor is adjusted in block 202 to increase (or decrease) the delay for a signal travelling through the at least one delay line, the peak-to-peak delay variation for signals with different frequencies in the passband of the filter is increased (or decreased). The at least one second variable capacitor can have some or all of the same characteristics as the at least one second variable capacitor 112, 114 discussed above; and therefore, the capacitance of the at least one second variable capacitor in method 200 can be varied in the same way as above in FIG. 1A. Moreover, the at least one second variable capacitor can be an electronically variable capacitor such as in the form of varactor diodes. In exemplary embodiments, the at least one second variable capacitor is a variable series capacitor. In other embodiments, the at least one second variable capacitor is a variable shunt capacitor. In exemplary embodiments, utilizing block 204, the peak-to-peak variation is decreased to less than two picoseconds. In some embodiments, method 200 can be performed iteratively, as discussed above in FIG. 1A.

The at least one delay line can have some or all of the same characteristics as the delay line 100A discussed above in FIGS. 1A-1B. Namely, in exemplary embodiments, the at least one delay line can have a resolution of less than one picosecond between signals received by the at least one delay line. Moreover, the at least one filter can have some or all of the same characteristics as the filter 106A in FIGS. 1A-1B. Specifically, in exemplary embodiments, the passband of the filter can be 4.2-4.4 gigahertz after the method 200 is performed. Further, in exemplary embodiments, the filter can be a second-order bandpass filter comprising: one variable shunt capacitor, one shunt inductor, one variable series capacitor and one series inductor.

EXAMPLE EMBODIMENTS

Example 1 includes a delay line configured to apply an adjustable time delay to an electromagnetic signal travelling through the delay line, the delay line comprising: a filter including: a first variable capacitor, wherein a capacitance of the first variable capacitor is configured to adjust the delay applied to the electromagnetic signal travelling through the delay line when varied.

Example 2 includes the delay line of Example 1, wherein the first variable capacitor is a variable shunt capacitor.

Example 3 includes the delay line of any of Examples 1-2, wherein the filter further comprises a second variable capacitor, wherein a capacitance of the second variable capacitor is configured to adjust the peak-to-peak delay variation for signals with different frequencies in a passband of the filter when varied.

Example 4 includes the delay line of Example 3, wherein the first variable capacitor is a variable shunt capacitor and the second variable capacitor is a variable series capacitor.

Example 5 includes the delay line of any of Examples 3-4, wherein the first variable capacitor is an electronically variable capacitor; and wherein the second variable capacitor is an electronically variable capacitor.

Example 6 includes the delay line of Example 5, wherein the first variable capacitor and the second variable capacitor are at least one of a varicap diode, a varactor diode, a variable capacitance diode, a variable reactance diode, a tuning diode, or a digitally tuned capacitor.

Example 7 includes the delay line of any of Examples 1-6, wherein the delay line includes a physical length configured to result in additional delay applied to the electromagnetic signal travelling through the delay line.

Example 8 includes the delay line of any of Examples 1-7, wherein the delay line is integrated into a radar altimeter system; and wherein the electromagnetic signal traveling through the delay line is a radar altimeter signal.

Example 9 includes a method comprising: varying a capacitance of a first variable capacitor in a filter of a delay line to adjust the delay for an electromagnetic signal passing through the delay line.

Example 10 includes the method of Example 9, wherein the first variable capacitor is a variable shunt capacitor.

Example 11 includes the method of any of Examples 9-10, further comprising varying a capacitance of a second variable capacitor in the filter of the delay line to adjust the peak-to-peak delay variation for signals with different frequencies in a passband of the filter.

Example 12 includes the method of Example 11, wherein the first variable capacitor is a variable shunt capacitor and the second variable capacitor is a variable series capacitor.

Example 13 includes the method of any of Examples 11-12, wherein varying the capacitance of the first variable capacitor is done electronically and wherein varying the capacitance of the second variable capacitor is done electronically; and wherein the first variable capacitor and the second variable capacitor are at least one of a varicap diode, a varactor diode, a variable capacitance diode, a variable reactance diode, a tuning diode, or a digitally tuned capacitor.

Example 14 includes the method of any of Examples 11-13, wherein varying the capacitance of the first variable capacitor includes repeatedly varying the capacitance of the first variable capacitor and varying the capacitance of the second variable capacitor includes repeatedly varying the capacitance of the second variable capacitor until the desired delay for the electromagnetic signal passing through the delay line and the desired peak-to-peak delay variation for signals with different frequencies in the passband of the filter is achieved.

Example 15 includes the method of any of Examples 11-13, wherein varying the capacitance of the first variable capacitor and varying the capacitance of the second variable capacitor comprises setting the capacitance of the first variable capacitor and setting the capacitance of the second variable capacitor without iteration.

Example 16 includes the method of any of Examples 9-15, wherein the delay line includes a physical length configured to result in additional delay applied to the electromagnetic signal travelling through the delay line.

Example 17 includes the method of any of Examples 9-16, wherein the delay line is integrated into a radar altimeter system; and wherein the electromagnetic signal traveling through the delay line is a radar altimeter signal.

Example 18 includes a delay line configured to apply an electronically variable group delay to an electromagnetic signal travelling through the delay line, the delay line comprising: wherein the delay line includes a physical length configured to result in an intrinsic delay applied to the electromagnetic signal travelling through the delay line; a filter configured to vary the electronically variable group delay applied to the electromagnetic signal traveling through the delay line in response to an electronic signal; and wherein the filter is further configured to adjust the peak-to-peak delay variation for signals with different frequencies in a passband of the filter in response to a second electronic signal.

Example 19 includes the delay line of Example 18, wherein the filter is a bandpass filter.

Example 20 includes the delay line of any of Examples 18-19, wherein the delay line is integrated into a radar altimeter system; and wherein the electromagnetic signal traveling through the delay line is a radar altimeter signal.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A delay line configured to apply an adjustable time delay to an electromagnetic signal travelling through the delay line, the delay line comprising:
   a filter including:
      a first variable capacitor, wherein a capacitance of the first variable capacitor is configured to adjust the time delay applied to the electromagnetic signal travelling through the delay line when varied; and
      a second variable capacitor, wherein a capacitance of the second variable capacitor is configured to adjust a peak-to-peak delay variation for signals with different frequencies of the electromagnetic signal in a passband of the filter when varied.

2. The delay line of claim 1, wherein the first variable capacitor is a variable shunt capacitor.

3. The delay line of claim 1, wherein the delay line is integrated into a radar altimeter system; and
   wherein the electromagnetic signal traveling through the delay line is a radar altimeter signal.

4. The delay line of claim 1, wherein the first variable capacitor is a variable shunt capacitor and the second variable capacitor is a variable series capacitor.

5. The delay line of claim 1, wherein the first variable capacitor is an electronically variable capacitor; and
   wherein the second variable capacitor is an electronically variable capacitor.

6. The delay line of claim 5, wherein the first variable capacitor and the second variable capacitor are each one of a varicap diode, a varactor diode, a variable capacitance diode, a variable reactance diode, a tuning diode, or a digitally tuned capacitor.

7. The delay line of claim 1, wherein the delay line includes a physical length configured to result in additional delay applied to the electromagnetic signal travelling through the delay line.

8. A delay line configured to apply an electronically variable group delay to an electromagnetic signal travelling through the delay line, the delay line comprising:
   a physical length configured to result in an intrinsic group delay applied to the electromagnetic signal travelling through the delay line;
   a filter configured to vary the electronically variable group delay applied to the electromagnetic signal traveling through the delay line in response to an electronic signal; and
   wherein the filter is further configured to adjust a peak-to-peak delay variation for signals with different frequencies of the electromagnetic signal in a passband of the filter in response to a second electronic signal.

9. The delay line of claim 8, wherein the filter is a bandpass filter.

10. The delay line of claim 8, wherein the delay line is integrated into a radar altimeter system; and
    wherein the electromagnetic signal traveling through the delay line is a radar altimeter signal.

11. A method comprising:
    varying a capacitance of a first variable capacitor in a filter of a delay line to adjust the time delay for an electromagnetic signal passing through the delay line; and
    varying a capacitance of a second variable capacitor in the filter of the delay line to adjust a peak-to-peak delay variation for signals with different frequencies of the electromagnetic signal in a passband of the filter.

12. The method of claim 11, wherein the first variable capacitor is a variable shunt capacitor and the second variable capacitor is a variable series capacitor.

13. The method of claim 11, wherein varying the capacitance of the first variable capacitor is done electronically and wherein varying the capacitance of the second variable capacitor is done electronically; and
    wherein the first variable capacitor and the second variable capacitor are each one of a varicap diode, a varactor diode, a variable capacitance diode, a variable reactance diode, a tuning diode, or a digitally tuned capacitor.

14. The method of claim 11, wherein varying the capacitance of the first variable capacitor includes repeatedly varying the capacitance of the first variable capacitor and varying the capacitance of the second variable capacitor includes repeatedly varying the capacitance of the second variable capacitor until a desired delay for the electromagnetic signal passing through the delay line and a desired peak-to-peak delay variation for signals with different frequencies in the passband of the filter is achieved.

15. The method of claim 11, wherein varying the capacitance of the first variable capacitor and varying the capacitance of the second variable capacitor comprises setting the capacitance of the first variable capacitor and setting the capacitance of the second variable capacitor without subsequently varying the capacitance of the first variable capacitor.

16. The method of claim 11, wherein the delay line includes a physical length configured to result in additional delay applied to the electromagnetic signal travelling through the delay line.

17. The method of claim 11, wherein the delay line is integrated into a radar altimeter system; and
    wherein the electromagnetic signal traveling through the delay line is a radar altimeter signal.

18. The method of claim 11, wherein the first variable capacitor is a variable shunt capacitor.

* * * * *